United States Patent
Rajasekhar

(10) Patent No.: US 8,576,002 B2
(45) Date of Patent: Nov. 5, 2013

(54) ADC PREAMPLIFIER AND THE MULTISTAGE AUTO-ZERO TECHNIQUE

(75) Inventor: Sanjay Rajasekhar, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 117 days.

(21) Appl. No.: 13/173,406

(22) Filed: Jul. 20, 2011

(65) Prior Publication Data

US 2012/0242404 A1 Sep. 27, 2012

Related U.S. Application Data

(60) Provisional application No. 61/454,828, filed on Mar. 21, 2011.

(51) Int. Cl.
*H03F 1/02* (2006.01)
(52) U.S. Cl.
USPC .................................... 330/9; 330/69; 330/51
(58) Field of Classification Search
USPC .................................................. 330/9, 69, 51
See application file for complete search history.

(56) References Cited

U.S. PATENT DOCUMENTS

| | | | |
|---|---|---|---|
| 5,142,238 A | * | 8/1992 | White ................................ 330/9 |
| 5,565,813 A | * | 10/1996 | Connell et al. .................... 330/9 |
| 6,011,403 A | * | 1/2000 | Gillette ...................... 324/762.02 |
| 7,038,532 B1 | * | 5/2006 | Bocko et al. .................... 327/554 |
| 7,292,095 B2 | * | 11/2007 | Burt et al. .......................... 330/9 |
| 7,834,685 B1 | * | 11/2010 | Pertijs ............................... 330/9 |
| 7,936,299 B2 | * | 5/2011 | Astley et al. .................. 341/172 |

OTHER PUBLICATIONS

Enz et al., 1996, "Circuit Techniques for Reducing the Effects of Op-Amp Imperfections: Autozeroing, Correlated Double Sampling, and Chopper Stabilization", Proceedings of the IEEE; 84(11):1584-1614.

* cited by examiner

*Primary Examiner* — Patricia Nguyen
(74) *Attorney, Agent, or Firm* — Kenyon & Kenyon LLP

(57) ABSTRACT

Embodiments of the present invention provide a sample and hold amplifier that provides a preamplifier with a multi-stage zeroing architecture. The multi-stage architecture reduces effects of parasitic capacitance exponentially over prior attempts, which yields increased accuracy.

16 Claims, 6 Drawing Sheets

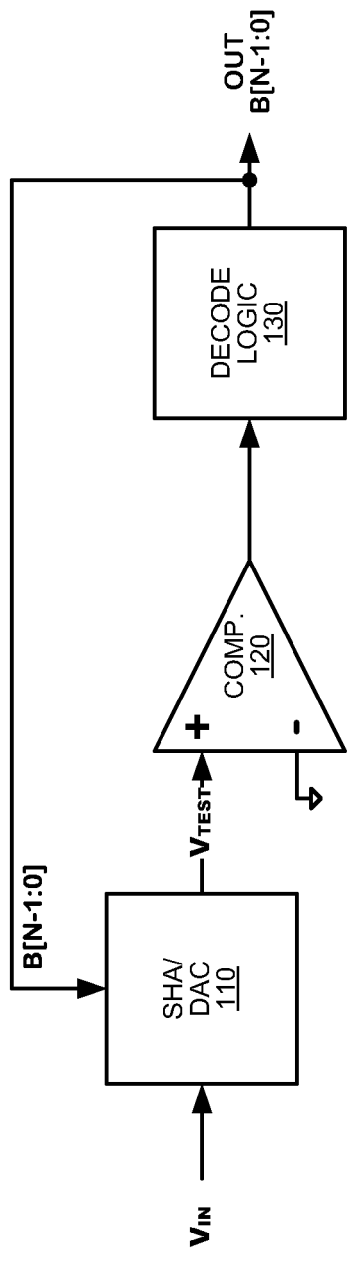
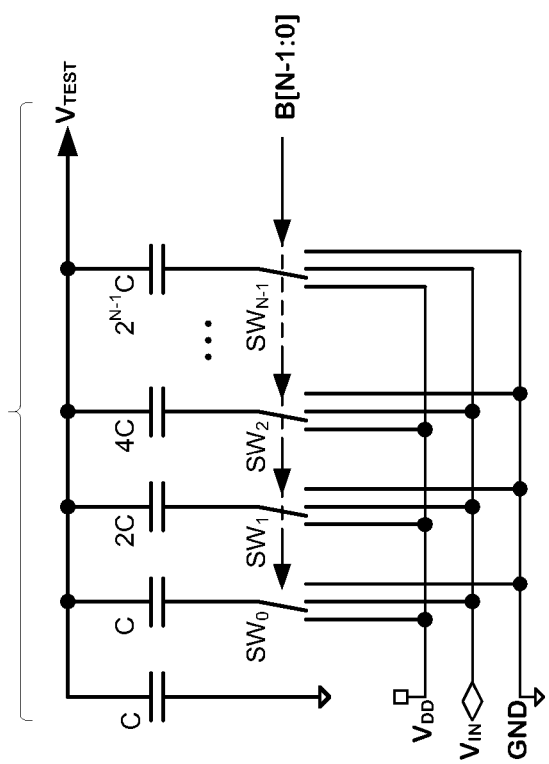
FIG. 1
100
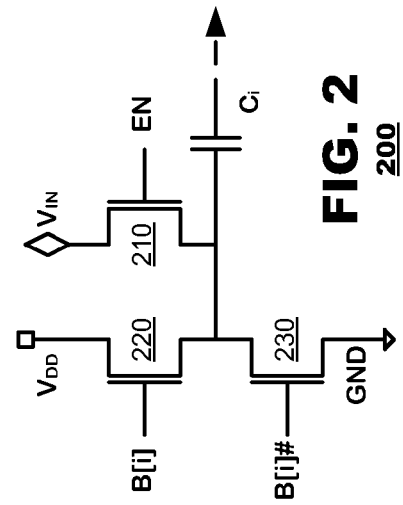
FIG. 2
200

300

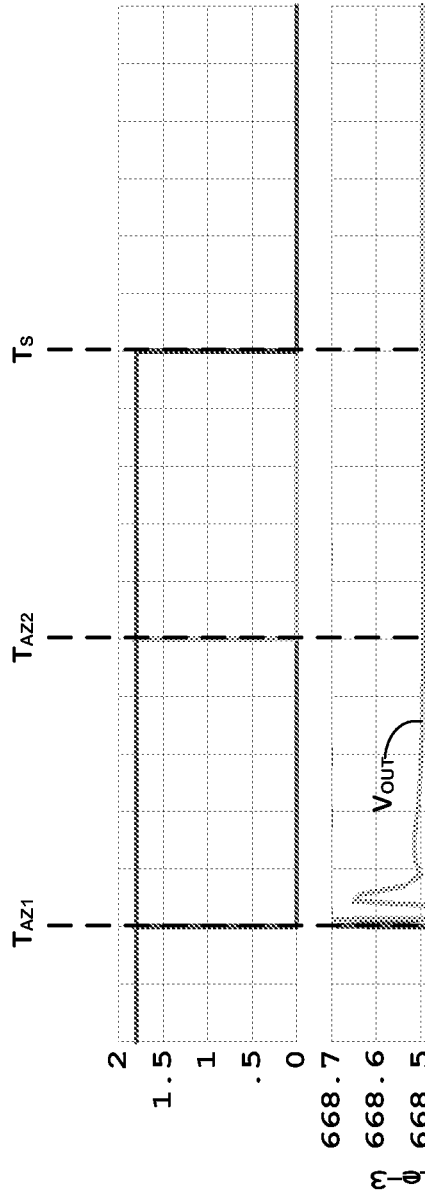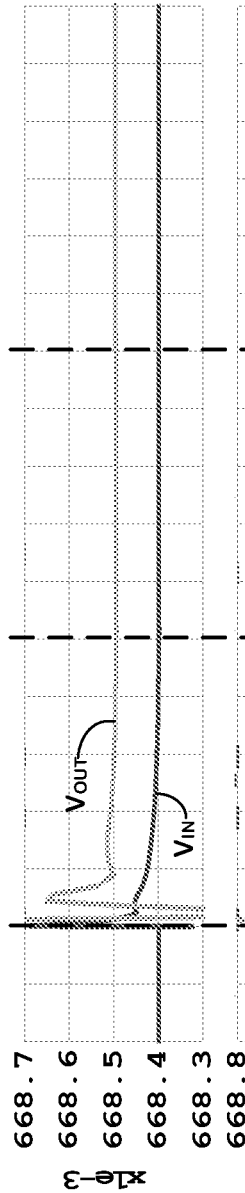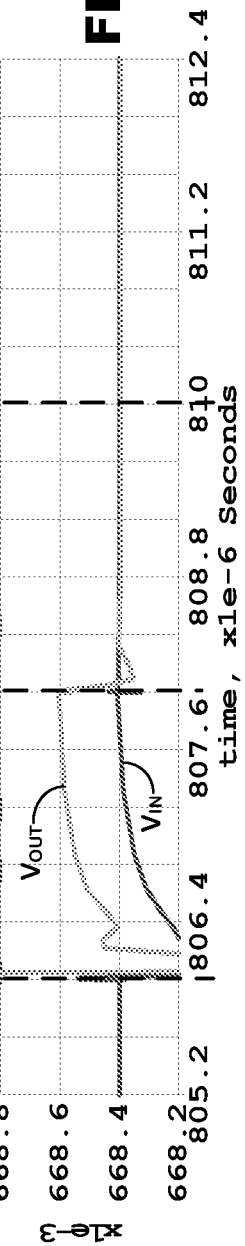

900

ADC PREAMPLIFIER AND THE MULTISTAGE AUTO-ZERO TECHNIQUE

RELATED APPLICATION

This application claims benefit of priority from U.S. provisional application "ADC Preamplifier and the Multistage Auto-zero Technique," Ser. No. 61/454,828, filed Mar. 21, 2011, the disclosure of which is incorporated herein by reference in its entirety.

BACKGROUND

The present invention relates to sample and hold amplifiers (SHAs) and, in particular, to reducing voltage offset errors that can be induced by pre-amplifiers that drive SHAs.

Sample and hold amplifiers, as their name implies, are electronic devices that sample a time-varying voltage and amplify it with predetermined gain (sometimes, unity gain). Switched capacitor amplifiers, switched capacitor integrators and switched capacitor filters are examples of circuit systems that use SHAs at their input. An input voltage is sampled by the SHA and held for a predetermined time so that it may be processed by subsequent circuit stages in the system. A pre-amplifier is often used at the input of a SHA.

SHAs, therefore, include a switch array that connects internal capacitors to an input voltage during a sampling operation. The switch array disconnects the capacitors from the input signal and connects the capacitors to other reference voltages during other phases of operation. The switch array is made up of a variety of transistor switches that are driven to be conductive and non-conductive as appropriate during the various phases of operation. Although transistors ideally should conduct no current when driven to be non-conductive, current leakage can occur at times, particularly when the SHA is operating at high temperature (in excess of 120° C.). The leakage problem manifests itself as a current drawn from the input source. If the input voltage source cannot supply the current that SHA demands, a pre-amplifier is often placed at the input of the SHA. Use of preamplifiers, however, induces errors of their own, discussed below in the context of an analog to digital converter.

Analog to digital converters (ADCs) are known circuits that sample an analog voltage within a predetermined voltage range and generate a digital code representing the voltage's magnitude. A variety of ADC architectures are available to circuit designers, including the successive approximation register (SAR) ADC 100, shown in FIG. 1 in block diagram form.

The SAR ADC 100 typically includes a sample & hold digital to analog converter ("SHA/DAC") 110, a comparator 120, and a decode logic 130. The SHA/DAC 110 may sample the analog input signal ($V_{IN}$) and generate test voltages ($V_{TEST}$) during bit trials. The SHA/DAC 110 may include a capacitor array that includes a plurality of binary weighted capacitors (C to $2^{N-1}$C) The array may include a capacitor for each of the N bit positions of the output code. Each capacitor may be coupled at a bottom plate to a three-position switch that selectively connects the plate to the input voltage $V_{IN}$, to a reference voltage ($V_{REF}$) or to ground.

The comparator 120 may compare the SHA/DAC's test voltage to ground or some other reference voltage. The decode logic 130 may interpret the comparator's output and generate an N bit output code. In the ADC 100 illustrated in FIG. 1, the SHA is integrated with a SHA/DAC 110 to generate test voltages to the comparator. The SHA/DAC 110 includes the switched capacitor array in which the above-mentioned errors can arise.

The ADC may operate in two modes, a sampling mode and a bit-trial mode. During the sampling mode, bottom plates of all switchable SHA/DAC capacitors are connected to $V_{IN}$, and top plates of all capacitors are connected to ground. Therefore, all switchable capacitors develop a voltage $-V_{IN}$ across them (measured from top plate to bottom plate).

During the bit-trial mode, the SHA/DAC 110 iteratively tests each bit position in order, starting with a most significant bit (MSB). The top plates of all capacitors are disconnected from ground and connected to the input of the comparator. Switches of any previously-tested bit position are set to their derived values. Bit positions deemed to be a "1" are connected to $V_{REF}$, and bit positions deemed to be a "0" are connected to ground. A switch of a next bit position to be tested is connected to $V_{REF}$.

The comparator 120 compares the resulting voltage $V_{TEST}$ to the voltage on its second input (ground). If the $V_{TEST}$<ground, the next bit position is determined to be a "1". Otherwise, the next bit position is determined to be "0". This operation repeats until all bit positions have been tested.

For example, to test the MSB bit position, the switch corresponding to the $2^{N-1}$C capacitor is connected to $V_{REF}$ and the switches of all other bit positions are connected to ground. Due to charge sharing among the capacitors, a test voltage $V_{TEST}$ is developed corresponding to $½*V_{REF}-V_{IN}$. If the comparator determines that $V_{TEST}$<ground, the MSB will be determined to be a "1". Otherwise, the MSB will be determined to be a "0".

For the next iteration, the MSB switch will be set to $V_{REF}$ if a "1" or to ground if a "0" and the switch of the next bit position (the $2^{N-2}$C capacitor) will be set to $V_{REF}$. In this iteration, the SHA/DAC will develop a $V_{TEST}$ voltage corresponding to $¾*V_{REF}-V_{IN}$ if the MSB was determined to be a "1" or $¼*V_{REF}-V_{IN}$ if the MSB was determined to be a "0". The SHA/DAC 110 proceeds in this manner until all N bits have been tested.

FIG. 2 is a circuit diagram illustrating implementation of the switched capacitor array used in a SHA. The switch is implemented as three transistors 210-230, each coupled to the bottom plate of its associated capacitor C. Transistor 210 is coupled to the input voltage $V_{IN}$. Transistor 220 is coupled to $V_{REF}$. Transistor 230 is coupled to ground.

In an ideal case, when the ADC is operating in sampling mode, transistors 220 and 230 are non-conductive, which causes the capacitor $C_i$ to charge to input voltage $V_{IN}$. In practice, however, the transistors 220, 230 are not perfectly non-conductive and, therefore, the capacitor $C_i$ charges to an incorrect level. This problem can be pronounced when the system runs at high temperatures (ex., 150° C.). Thus, when the SHA/DAC 110 runs through its bit trials, it does so with an erroneous sampled voltage.

FIG. 3 is a block diagram of an ADC 300 with a preamplifier. The ADC 300 may include a preamplifier 310, a SHA/DAC 320, a comparator 330, and a decoder 340. The preamplifier 310 may receive an input signal $V_{IN}$ and generates an amplified signal $V_{AMP}$ at a predetermined gain (which may be unity in appropriate circumstances). The SHA/DAC 320 may receive the amplified signal $V_{AMP}$ and digital control signals B[N−1:0] and generates test voltages $V_{TEST}$ for bit trials. The comparator 340 may include inputs for the test voltages $V_{TEST}$ from the SHA/DAC and for a reference voltage (typically, ground). The decoder 340 may interpret output from the comparator 330 and build a digital code therefrom during the bit trials.

At the end of operation, the ADC 300 may generate an N bit digital code comprised of bits B[N−1:0]. The preamplifier 310 may amplify the input signal $V_{IN}$ to a level sufficient to drive the SHA/DAC capacitors and overcome current loss through the $V_{REF}$− and ground-coupled transistor switches. Preamplifiers typically generate signal artifacts of their own, including voltage offsets that may reach as high as ±3 mV in an ADC that has a least significant bit (LSB) step size of 300 μV. Moreover, the voltage offsets tend to manifest themselves randomly from device to device because they arise from manufacturing process variations. Voltage offsets also can arise from insufficient open loop gain of the amplifier.

To overcome this problem, Enz proposed a preamplifier with an auto-zeroing operation. Enz, et al., *Circuit Techniques for Reducing the Effects of Op-Amp Imperfections: Autozeroing, Correlated Double Sampling, and Chopper Stabilization*, Proc. IEEE, vol. 84, no. 11, pp. 1584-1614 (November 1996). However, the Enz scheme tends to have issues with stability and settling. In high accuracy ADC applications, it is necessary to reduce contributions of voltage offsets even further than is possible in the FIG. 3 architecture.

Therefore, there is a need in the art for a preamplification scheme for a sample and hold unit that substantially reduces preamplifier voltage offsets without requiring large capacitances.

BRIEF DESCRIPTION OF THE DRAWINGS

FIG. 1 is a simplified block diagram a successive approximation register (SAR) ADC.

FIG. 2 is a circuit diagram of a switched capacitor array used in a SHA.

FIG. 8(a) illustrates a timing diagram of an amplifier system according to an embodiment of the present invention.

FIG. 8(b) illustrates a simulation result of an amplifier system according to an embodiment of the present invention.

FIG. 8(c) illustrates a simulation result of an amplifier system according to an embodiment of the present invention.

DETAILED DESCRIPTION

Embodiments of the present invention may provide a sample and hold amplifier system including an amplifier with a pair of input terminals and an output terminal, and an auto-zeroing stage. The auto-zeroing stage includes a capacitor coupled to an input terminal of the amplifier, and a plurality of switches. The capacitor is switchably coupled to the output terminal, and an upper and lower plate of the capacitor are switchably coupled to an input voltage terminal.

Embodiments of the present invention may provide a method of capturing an input voltage. In a first phase, the method includes applying the input voltage to an amplifier to generate an output voltage and developing a voltage across a capacitor representing a difference between the input voltage and the output voltage. In a second phase, the method includes reversing orientation of the capacitor voltage and applying a combination of the input voltage and the reversed capacitor voltage to the amplifier.

Embodiments of the present invention may provide an amplifier system including an amplifier with a pair of input terminals and an output terminal, and a plurality of auto-zeroing stages. Each stage includes a capacitor and a plurality of switches. Each capacitor is switchably coupled to the output terminal and switchably coupled to an input voltage terminal.

Embodiments of present invention may provide an amplifier system including an amplifier with an output terminal, and a plurality of auto-zeroing stages. Each stage may include a capacitor, a first pair of switches that, when activated, couple a first capacitor terminal of the capacitor to an input of the respective stage and a second capacitor terminal to the amplifier output terminal, and a third switch that, when activated, couples the second capacitor terminal to the input of the stage.

Embodiments of the present invention may provide a method of capturing an input voltage. The method includes in a first phase, in a first phase, applying the input voltage to an amplifier to generate an output voltage and developing a voltage across a capacitor of a first stage representing a difference between the input voltage and the output voltage. In successive phases, reversing orientation of the capacitor voltage of a preceding stage, applying a combination of the input voltage and the reversed capacitor voltages of all preceding stages to the amplifier, and developing a voltage across a capacitor of a next stage representing a difference between the input voltage and the output voltage.

Figure 3:
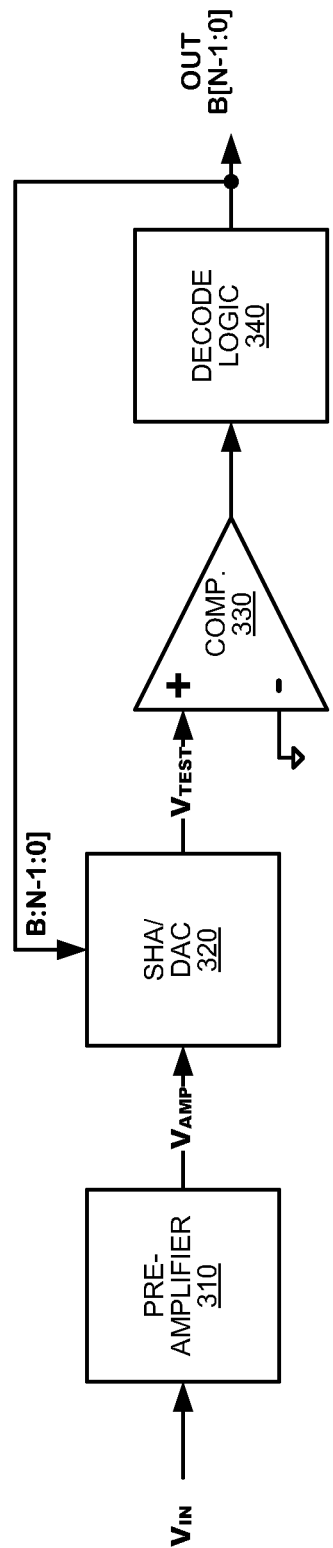
FIG. 3 is a simplified block diagram of an ADC with a preamplifier.
Figure 4:
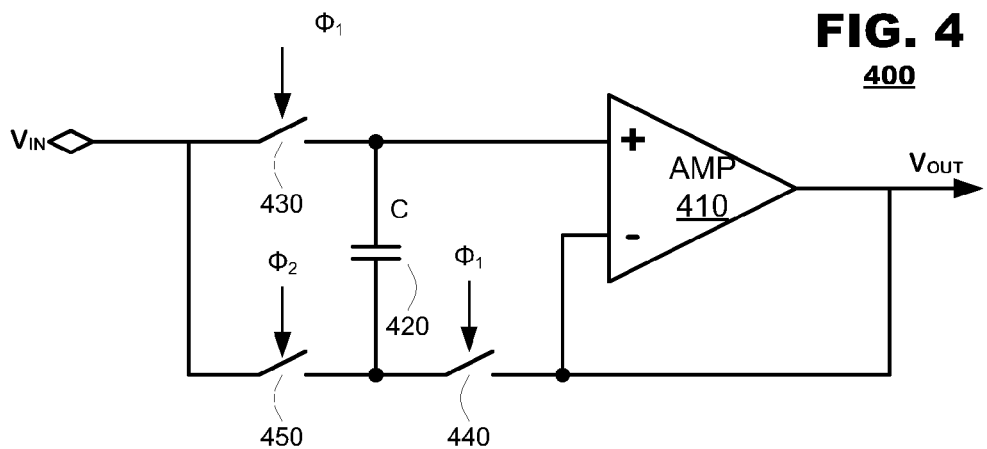
FIG. 4 illustrates an amplifier system with single stage auto-zeroing according to an embodiment of the present invention.

FIG. 4 illustrates a preamplifier 400 for use with an ADC according to an embodiment of the present invention. The preamplifier 400 may include an amplifier 410, a capacitor 420, and a plurality of switches 430-450. The amplifier 410 may include a pair of input terminals and an output. The pair of input terminals may include an inverting input and a non-inverting input. The inverting input may be coupled to the amplifier's output.

The capacitor 410 may have an upper plate and a lower plate separated by a dielectric. The upper plate may be coupled to the non-inverting input of the amplifier 410. The plurality of switches 430-450 may include a first switch 430, a second switch 440, and a third switch 450. The first switch 430 may couple an input voltage terminal ($V_{IN}$) to the upper plate of the capacitor 420. The second switch 440 may couple the amplifier's output terminal to the lower plate of the capacitor 420. The third switch 450 may couple the input voltage terminal $V_{IN}$ of to the lower plate of the capacitor 420.

The preamplifier 400 may be manufactured as an integrated circuit. Further, the switches 430-450 may be embodied as transistors.

The preamplifier 400 may operate in two non-overlapping phases of operation. Switches 430 and 440 may be closed during a first phase of operation and open during the second phase of operation. Switch 450 may be open during the first phase and closed during the second phase.

Figure 5A:
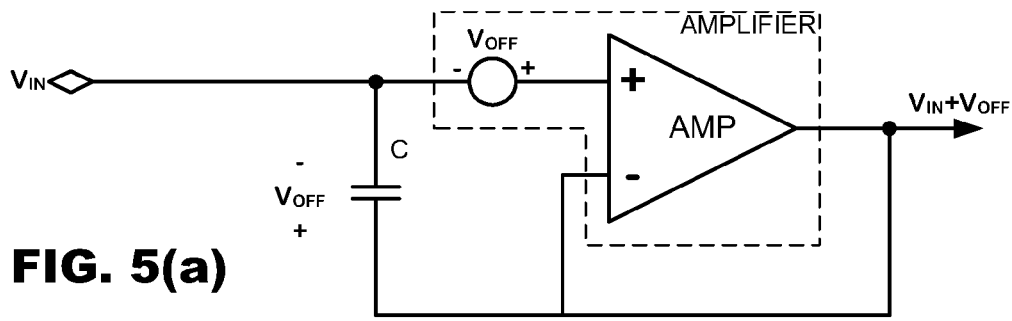
FIG. 5(a) illustrates a model operation during a first phase of an amplifier system according to an embodiment of the present invention.
Figure 5B:
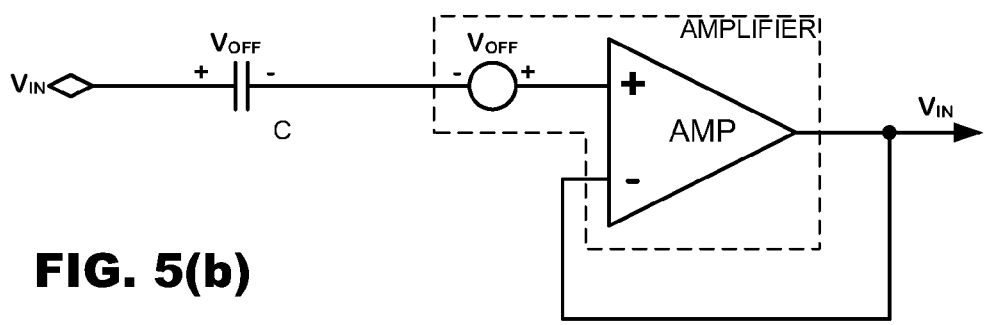
FIG. 5(b) illustrates a model operation during a second phase of an amplifier system according to an embodiment of the present invention.

FIGS. 5(*a*) and 5(*b*) model operation of the preamplifier of FIG. 4 during the two phases of operation, according to an embodiment of the present invention. As noted, the preamplifier 410 of FIG. 4 may introduce its own voltage offset during operation and, therefore, FIGS. 5(*a*) and 5(*b*) illustrate the amplifier as an ideal amplifier with an associated voltage source $V_{OFF}$.

FIG. 5(*a*) illustrates a configuration of the preamplifier during the first phase of operation, when switches 430 and 440 are closed but switch 450 is open. During this first phase, the amplifier may generate an output of $V_{OUT}=V_{IN}+V_{OFF}$. The capacitor, therefore, may develop a voltage of $V_{OFF}$ across it because $V_{IN}$ may charge the upper plate of the capacitor while $V_{OUT}$, which is $V_{IN}+V_{OFF}$, may charge the lower plate of the capacitor.

FIG. 5(*b*) illustrates a configuration of the preamplifier during the second phase of operation, when switch 450 is closed but switches 430 and 440 are open. During this second phase, the non-inverting input of the amplifier may receive an input voltage of $(V_{IN}-V_{OFF}+V_{OFF})$. The offset voltage of the amplifier then may be canceled by the offset voltage developed across the capacitor during the first phase of operation. Therefore, the output of the amplifier is very close to the input voltage ($V_{OUT} \approx V_{IN}$), and the amplifier is working closer to its ideal characteristics.

In practice, the amplifier may have a parasitic capacitance associated with it, which induces a charge sharing between the capacitor 420 of FIG. 4 and the parasitic capacitance. Thus, the preamplifier 400 of FIG. 4 may generate an output voltage according to:

$$V_{OUT} \approx V_{IN} + V_{OFF} * \frac{C_P}{C+C_P},$$

where $C_P$ represents the parasitic capacitance of the amplifier and C represents the capacitance of the capacitor 420.

Figure 6:
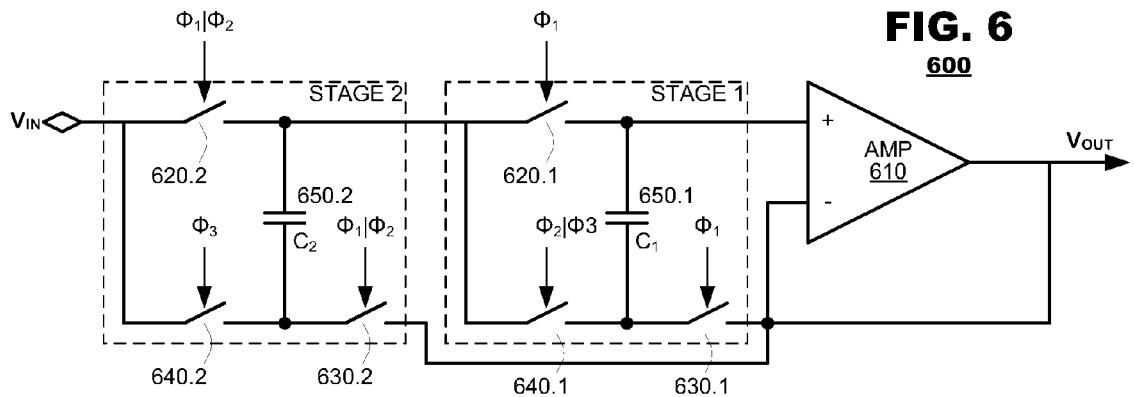
FIG. 6 illustrates an amplifier system with dual stage auto-zeroing according to an embodiment of the present invention.

FIG. 6 illustrates a preamplifier 600 according to another embodiment of the present invention. This amplifier design of preamplifier 600 may provide improved accuracy by reducing the parasitic effects.

The preamplifier 600 may include an amplifier 610 and a pair of auto-zeroing stages. The amplifier 610 may include a pair of input terminals and an output. An inverting input of the amplifier may be coupled to amplifier's output. Each auto-zeroing stage may include a capacitor 650.1, 650.2 and a plurality of switches 620.1,620.2-640.1, 640.2.

In the first stage (stage 1), the first switch 620.1 may be coupled to an upper plate of the capacitor 650.1 and to an input of the stage. The second switch 630.1 may couple the amplifier's output terminal to the lower plate of the capacitor 650.1. The third switch 640.1 may couple the lower plate of the capacitor 650.1 to an input of the first switch 630.1 of the first stage.

In the second stage (stage 2), the first switch 620.2 may be coupled to an upper plate of the capacitor 650.2 and to an input of the stage. The second switch 630.2 may couple the amplifier's output terminal to the lower plate of the capacitor 650.2. The third switch 640.2 may couple the lower plate of the capacitor 650.2 to an input of the first switch 630.2 of the second stage.

The preamplifier 600 may be manufactured as an integrated circuit. Further, the switches may be embodied as transistors.

The preamplifier 600 may operate over three phases of operation to sample the input signal and generate a mirroring output voltage with substantially reduced offset, as shown below.

Figure 7A:
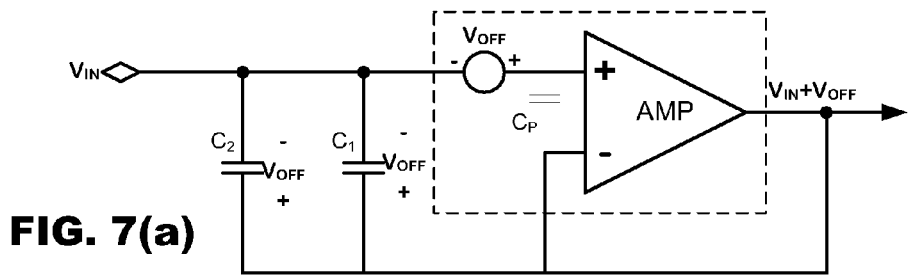
FIG. 7(a) illustrates a model operation during a first phase of an amplifier system according to an embodiment of the present invention.
Figure 7B:
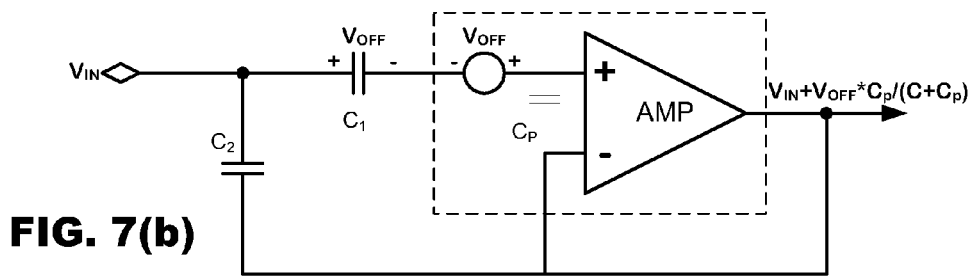
FIG. 7(b) illustrates a model operation during a second phase of an amplifier system according to an embodiment of the present invention.
Figure 7C:
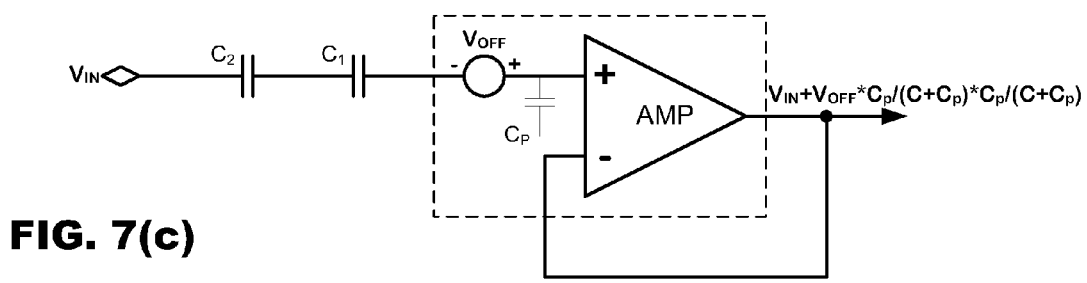
FIG. 7(c) illustrates a model operation during a third phase of an amplifier system according to an embodiment of the present invention.

FIGS. 7(*a*)-(*c*) model operation of the preamplifier of FIG. 6 during its operation according to an embodiment of the present invention. As noted, the amplifier 610 of FIG. 6 may introduce its own voltage offset during operation and may have its own parasitic capacitance associated with it. Therefore, FIGS. 7(*a*)-(*c*) model the amplifier as an ideal amplifier, an associated voltage source $V_{OFF}$ and parasitic capacitor $C_P$. Further, capacitance values of capacitors 650.1 and 650.2 both are taken as C.

FIG. 7(*a*) illustrates a configuration of the preamplifier during the first phase of operation. During this first phase, switches 620.1 and 630.1 in stage 1 are closed but switch 640.1 is open. Switches 620.2 and 630.2 in stage 2 are closed but switch 640.2 is open. The amplifier may generate an output of $V_{OUT}=V_{IN}+V_{OFF}$. The capacitors 650.1 and 650.2 both may develop a voltage of $V_{OFF}$ across them.

FIG. 7(*b*) illustrates a configuration of the preamplifier during the second phase of operation. During the second phase, switches 620.1 and 630.1 in stage 1 are open but switch 640.1 is closed. Switches 620.2 and 630.2 in stage 2 are closed but switch 640.2 is open. The amplifier may generate an output of $$V_{OUT} = V_{IN} + V_{OFF} * \frac{C_P}{C+C_P}.$$

The capacitor 650.2 in stage 2 develop a voltage of $$V_{OFF} * \frac{C_P}{C+C_P}$$

across it.

FIG. 7(*c*) illustrates a configuration of the preamplifier during the third phase of operation. During the third phase, switches 620.1 and 630.1 in stage 1 are open but switch 640.1 is closed. Switches 620.2 and 630.2 in stage 2 are open but switch 640.2 is closed. The amplifier may generate an output as $$V_{OUT} = V_{IN} + V_{OFF} * \frac{C_P}{C+C_P} * \frac{C_{P1}}{C+C_{P1}},$$

where $$C_{P1} = C * \frac{C_P}{C+C_P}.$$

The output voltage may be approximated as:

$$V_{OUT} \approx V_{IN} + V_{OFF} * \frac{C_P}{C+C_P} * \frac{C_P}{C+C_P} = V_{IN} + V_{OFF} * \left(\frac{C_P}{C+C_P}\right)^2.$$

The design of FIG. 6 improves accuracy of the preamplifier by mitigating the effects of parasitic capacitance. As noted above, the contribution of the offset voltage $V_{OFF}$ is reduced by approximately the square of a fractional scalar $$\left(\frac{C_P}{C+C_P}\right)^2.$$

This $$\left(\frac{C_P}{C+C_P}\right)^2$$

term has a value less than one and, therefore, it's square has an even smaller value.

Therefore, the dual-stage embodiment of FIG. 6 provides improved offset mitigation over the embodiment of FIG. 4 even when the same overall capacitance is used in each system. That is, capacitors 650.1, 650.2 of FIG. 6 each are half the capacitance of capacitor 420 of FIG. 4. Taking C1 (capacitor 650.1)=C2 (capacitor 650.2)=½ C (capacitor 420) and common values of $V_{IN}$ and $V_{OFF}$, the voltages output from the FIG. 4 embodiment may compare to those of the FIG. 6 embodiment as follows:

$$V_{OUT} \approx V_{IN} + V_{OFF} * \frac{C_P}{C+C_P} \qquad \text{FIG. 4}$$

$$V_{OUT} \approx V_{IN} + V_{OFF} * \left(\frac{C_P}{\frac{C}{2}+C_P}\right)^2. \qquad \text{FIG. 6}$$

Thus, the output voltage generated by the FIG. 6 will be more accurate than the FIG. 4 output for all values of $C_P$. If $C_P$ is large as compared to C, the advantages of the FIG. 6 embodiment may be reduced.

The output of the preamplifier may be sampled by the SHA/DAC after all the auto-zeroing stages have completed their performances. FIG. 8(a) illustrates a timing diagram of auto-zeroing and sampling performance, and FIGS. 8(b) and 8(c) illustrate simulated preamplifier performances of a single auto-zeroing stage and a pair of auto-zeroing stages respectively. At time $T_{AZ1}$, the performance of the first auto-zero stage, which is the first phase, may be complete. At time $T_{AZ2}$, the performance of the second auto-zero stage, which is the second phase, may be complete if the pre-amplifier includes a pair of auto-zeroing stages. And at time $T_S$, which is subsequent to time $T_{AZ2}$, the SHA/DAC may sample the output generated by the preamplifier. In a single auto-zero embodiment, $T_S$ may be subsequent to time $T_{AZ1}$.

FIG. 8(b) simulates a preamplifier performance with a single auto-zero stage. The simulation shows the relationship between $V_{OUT}$ and $V_{IN}$. FIG. 8(c) simulates a preamplifier performance with a pair of auto-zero stages As graph FIG. 8(c) shows, $V_{OUT}$ may follow $V_{IN}$ more closely after the second auto-zero stage performance is complete at time $T_{AZ2}$ compared to after the first auto-zero stage performance is complete at time $T_{AZ1}$. Therefore, the two auto-zero stage embodiment provides better performance than a single auto-zero stage embodiment for the same overall capacitance.

Figure 9:
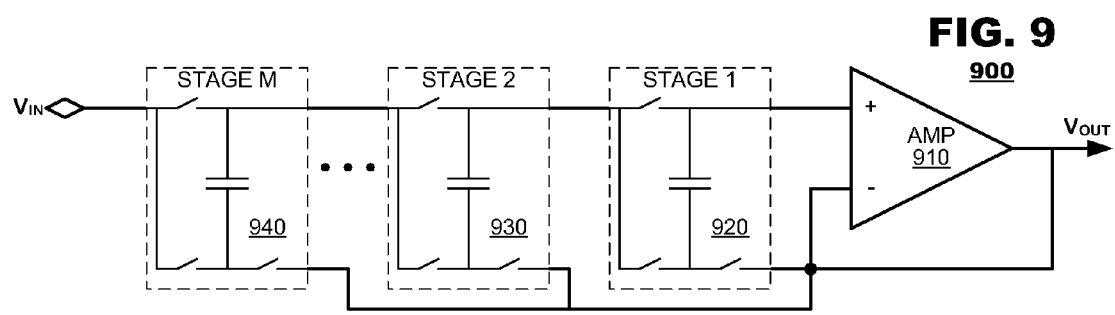
FIG. 9 illustrates an amplifier system with multiple auto-zeroing stages according to an embodiment of the present invention.

The principles of the present invention may be extended to greater numbers of auto-zeroing stages. FIG. 9 is a block diagram of a preamplifier 900 with an amplifier 910 and M stages 920-940 according to an embodiment of the present invention.

The stages of this embodiment may be constructed as in the foregoing embodiments, with a capacitor and associated switches. Operation of the amplifier 900 also may proceed over multiple stages in which, during each stage, an output voltage from a preceding stage is input to the amplifier's input to cancel some of the $V_{OFF}$ contribution and parasitic capacitance generated by the amplifier. The output voltage from that phase may be stored on a capacitor of another stage which may be input to the amplifier in a succeeding phase of operation.

At the conclusion of all phases of operation, the amplifier 900 may generate an output voltage of the form:

$$V_{OUT} \approx V_{IN} + V_{OFF} * \left(\frac{C_P}{C+C_P}\right)^M.$$

The $M^{th}$ order contribution of the $$\left(\frac{C_P}{C+C_P}\right)$$

renders the embodiment of FIG. 9 more accurate than the FIG. 4 or FIG. 6 embodiments (assuming M>2), where C is the capacitance used per stage.

An increase in the number of preamplifier stages, however, can introduce signal corruption due to charge injection. When considering the effects of charge injection, the preamplifier may generate an output voltage as follows:

$$V_{OUT} \approx V_{IN} + V_{OFF} * \left(\frac{C_P}{C+C_P}\right)^M + \frac{Q_{ch}M}{C},$$

where C represents the size of each capacitor per stage, $C_P$ is the amplifier parasitic capacitance, M is the number of stages, and $Q_{ch}$ represents channel charge of the switches in the auto-zero stages. Thus, the $$\frac{Q_{ch}M}{C}$$

term above represents voltage errors induced by the FIG. 9 design. Circuit designers may optimize the number of stages needed for their applications by considering trade offs presented by the $$\left(\frac{C_P}{C+C_P}\right)$$

scalar and the $$\frac{Q_{ch}M}{C}$$

error term and the overall timing complexity of managing multiple stages in the circuit.

Although the foregoing discussion illustrates preamplification for a sample and hold amplifier in an ADC system, the principles of the present invention are not so limited. The techniques illustrated above may be employed in almost any system that includes a sample and hold amplifier or any system that works on sampled data requiring a pre-amplifier.

For example, the auto-zeroing preamplifiers of the present invention may be used with SHAs in the other circuit systems mentioned above in the background, such as switched capacitor amplifiers, switched capacitor integrators and switched capacitor filters.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A pre-amplifier system, having an input terminal for an input signal, comprising:
    an amplifier with a pair of input terminals and an output terminal; and
    an auto-zeroing stage comprising:
        a capacitor having a first terminal coupled to an input terminal of the amplifier,
        a first pair of switches to connect the capacitor between the amplifier output and the input signal terminal in a first phase of operation, and
        a third switch to connect a second terminal of the capacitor to the input signal terminal in a second phase of operation.

2. The pre-amplifier system of claim 1, wherein the first and second switches are closed during a first phase and open during a second phase, and the third switch is open during the first phase and closed during the second phase.

3. The pre-amplifier system of claim 1, wherein the amplifier and auto-zeroing stage are provided in a common integrated circuit.

4. The pre-amplifier system of claim 1, wherein the switches are provided as transistors.

5. The pre-amplifier system of claim 1, further comprises:
    a second auto-zeroing stage coupled to the auto-zeroing stage, wherein the second auto-zeroing stage comprises a second capacitor and a second plurality of switches.

6. The pre-amplifier system of claim 1, wherein the pre-amplifier system is part of an analog-to-digital converter.

7. A method of capturing an input voltage, comprising:
    in a first phase,
        applying the input voltage to an amplifier to generate an output voltage,
        developing a voltage across a capacitor representing a difference between the input voltage and the output voltage; and
    in a second phase,
        reversing an orientation of the capacitor voltage, and
        applying a combination of the input voltage and the reversed capacitor voltage to the amplifier.

8. The method of claim 7, further comprising:
    wherein in the second phase, developing a second voltage across a second capacitor, and
    in a third phase,
        reversing the orientation of the second capacitor voltage, and
        applying a combination of the input voltage and reversed second capacitor voltage to the amplifier.

9. An amplifier system, comprising:
    an amplifier with a pair of input terminals and an output terminal; and
    a plurality of auto-zeroing stages, each stage comprising:
        a capacitor, and
        a plurality of switches,
    wherein each capacitor is switchably coupled to the output terminal and switchably coupled to an input voltage terminal.

10. The amplifier system of claim 9, wherein the plurality of switches comprises three switches.

11. The amplifier system of claim 10, wherein two switches are controlled in sync.

12. The amplifier system of claim 9 is an integrated circuit.

13. The amplifier system of claim 9, wherein the plurality of switches are provided as transistors.

14. An amplifier system, comprising:
    an amplifier with an output terminal; and
    a plurality of auto-zeroing stages, each stage comprising:
        a capacitor,
        a first pair of switches that, when activated, couple a first capacitor terminal of the capacitor to an input of the respective stage and a second capacitor terminal to the amplifier output terminal, and a
        third switch that, when activated, couples the second capacitor terminal to the input of the stage.

15. The amplifier of claim 14, wherein:
    the input of a first stage is coupled a terminal for a input voltage,
    inputs of remaining stages are coupled to the first capacitor terminal of a preceding stage, and
    an input terminal of the amplifier is coupled to the first capacitor terminal of a final stage.

16. A method of capturing an input voltage, comprising:
    in a first phase,
        applying the input voltage to an amplifier to generate an output voltage,
        developing a voltage across a capacitor of a first stage representing a difference between the input voltage and the output voltage; and
    in successive phases,
        reversing orientation of the capacitor voltage of a preceding stage,
        applying a combination of the input voltage and the reversed capacitor voltages of all preceding stages to the amplifier, and
        developing a voltage across a capacitor of a next stage representing a difference between the input voltage and the output voltage.

* * * * *